(12) United States Patent
Ichikawa

(10) Patent No.: US 7,102,197 B2
(45) Date of Patent: Sep. 5, 2006

(54) SEMICONDUCTOR DEVICE INCLUDING FIRST AND SECOND TRANSISTOR GROUPS AND SEMICONDUCTOR INTEGRATED CIRCUIT DEVICE

(75) Inventor: Kenji Ichikawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 4 days.

(21) Appl. No.: 10/766,899

(22) Filed: Jan. 30, 2004

(65) Prior Publication Data

US 2005/0045958 A1 Mar. 3, 2005

(30) Foreign Application Priority Data

Sep. 3, 2003 (JP) ............................. 2003-311430

(51) Int. Cl.
*H01L 23/62* (2006.01)

(52) U.S. Cl. ...................... 257/357; 257/365; 257/371

(58) Field of Classification Search ................ 257/357, 257/365, 371

See application file for complete search history.

(56) References Cited

U.S. PATENT DOCUMENTS

| 6,157,065 A * | 12/2000 | Huang et al. ................ 257/355 |
| 6,365,941 B1 * | 4/2002 | Rhee .......................... 257/357 |
| 2005/0179057 A1 * | 8/2005 | Tago et al. ................. 257/200 |

FOREIGN PATENT DOCUMENTS

JP 2001-189429 7/2001

* cited by examiner

*Primary Examiner*—Phat X. Cao
(74) *Attorney, Agent, or Firm*—Nixon Peabody LLP; Donald R. Studebaker

(57) ABSTRACT

A salicide block area is provided around a gate electrode. Polysilicon coupling portions are formed, which extend at plurality of points from the gate electrode to an area outside of an active region. A contact provided at this inactive region electrically connects the gate electrode to gate electrode metal wiring, which is provided above the gate electrode.

12 Claims, 7 Drawing Sheets

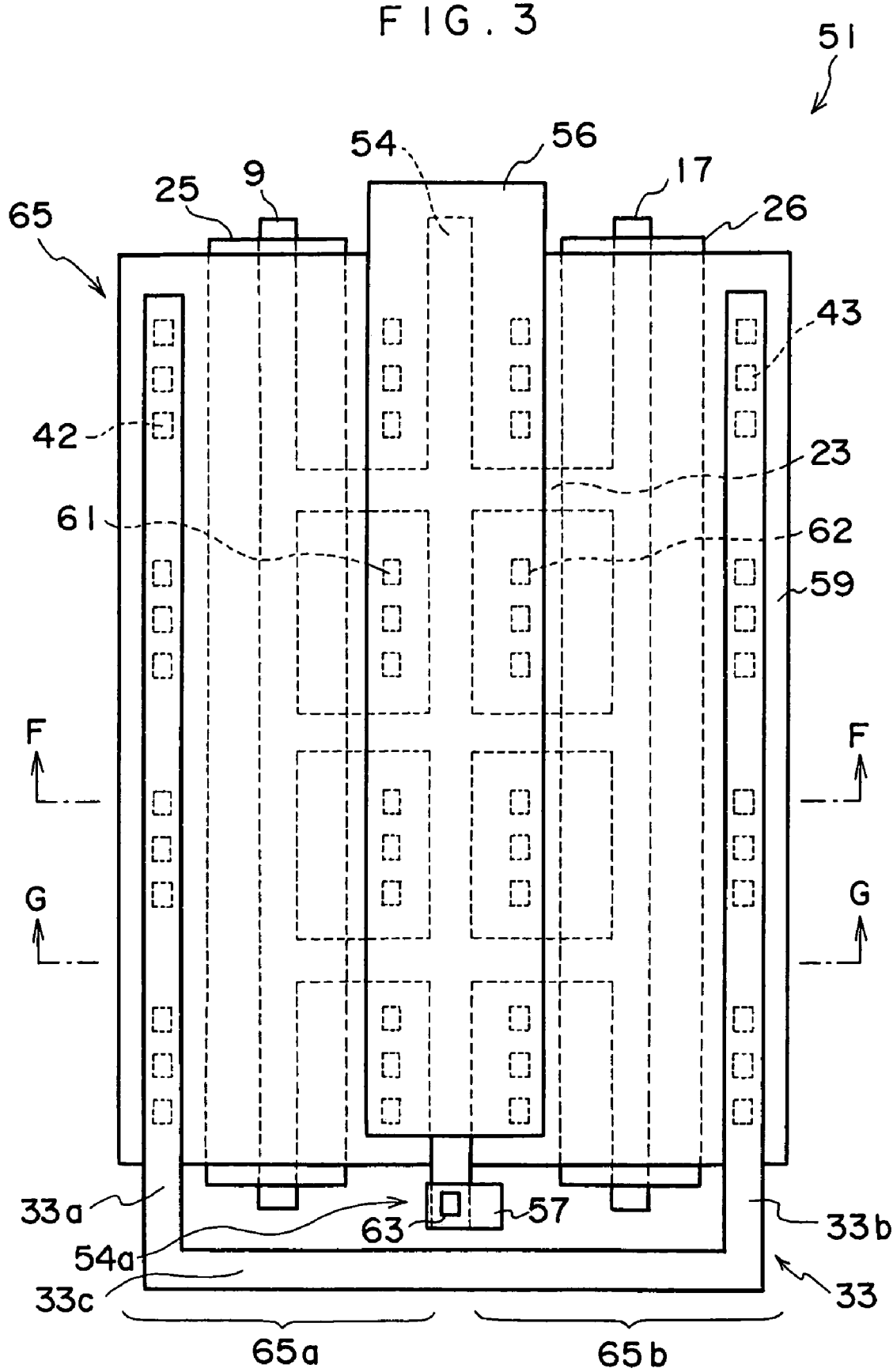

SEMICONDUCTOR DEVICE INCLUDING FIRST AND SECOND TRANSISTOR GROUPS AND SEMICONDUCTOR INTEGRATED CIRCUIT DEVICE

CROSS-REFERENCE TO RELATED APPLICATION

This application claims priority under 35 USC 119 from Japanese Patent Application No. 2003-311430, the disclosure of which is incorporated by reference herein.

BACKGROUND OF THE INVENTION

1. Field of the Invention

The present invention relates to a semiconductor device and a semiconductor integrated circuit device. More particularly, the invention relates to a structure of a semiconductor device adapted for preventing electrostatic discharge damage, which is to be formed as an output circuit of a semiconductor integrated circuit device.

2. Description of the Related Art

An example of semiconductor devices, which are conventionally known as the above type of semiconductor device, includes: a gate electrode formed, via a gate insulating layer, on a semiconductor layer of a silicon substrate; an impurity diffused layer formed on a semiconductor layer of an active region and forming a source region or a drain region; and contact areas formed on a gate electrode present in the active region, and does not include a silicide layer on the impurity diffused layer (see, for example, Japanese Patent Application Laid-Open (JP-A) No. 2001-189429, p. 1, FIG. 3).

By connecting the gate electrode to a metal wiring layer, which is disposed above and along the gate electrode, at a plurality of points via the contact areas, an apparent gate resistance can be reduced. However, a stress is generated when the contact areas for connection are formed on the gate electrode. In order to avoid the stress affecting the gate insulating layer, and in order to prevent the gate insulating layer from being damaged by etching, a pad-like insulating layer is provided under the gate electrode at areas where the contact areas are formed. Therefore, the structure becomes complicated and this complicates the layout design.

Technical backgrounds for the invention will be described below in more detail.

In recent years, development of SOI (Silicon On Insulator) devices, which are excellent in accomplishing high-speed LSIs and low power consumption, are progressing. For producing the SOI devices, a SALICIDE (Self-Aligned Silicide) process is particularly favored. The salicide process is a technique of forming silicide, which is a compound of silicon and a metal, on an impurity diffused layer and polysilicon.

FIGS. 5A and 5B show a structure of a main portion of a salicide NMOS transistor 100 created on a SOI substrate. FIG. 5A is a plan view, and FIG. 5B is a sectional view of the main portion taken along line A—A in FIG. 5A.

The NMOS transistor is fabricated by a MOS process on the SOI substrate, which includes a buried oxide film 102 on a P semiconductor substrate 101.

Low resistance silicides 106, 107 and 108 are respectively formed on impurity diffused layers formed of a source (or drain) region 103 and a drain (or source) region 104, as well as on a gate electrode 105 formed of polysilicon. An interlayer insulating layer 115 is formed over the silicides, and contacts 116, which connect the silicides 106 and 107 to metal wiring (not shown) formed on the interlayer insulating layer 115, are formed in the interlayer insulating layer 115.

Usually, such a salicide transistor is very weak to ESD (Electro-Static Discharge). This is because that a surge current due to ESD flows through the low resistance silicide layer which lies above the drain or source, and a stress of a heavy-current after breakdown concentrates at a PN junction surface region 110 or 111, and therefore, junction breakdown is likely to be caused. This surge current is generated in the following mechanism.

In a case of a NMOS transistor, for example, when a positive surge voltage due to ESD is applied to the drain, breakdown is caused between the drain region (N+) and the body region (P−). Then, holes are accumulated in the body region and a potential at the body region is raised. As the potential at the body region is raised beyond a potential barrier at the PN junction between the body region (P−) and the source region (N+), a parasitic NPN bipolar transistor, formed of the drain region (N+)—the body region (P−)—the source region (N+), is turned on and the ESD surge current flows from the drain to the source as a bipolar current.

In order to prevent element breakdown caused by ESD, salicide block-type NMOS transistors have been proposed. FIGS. 6A and 6B show a structure of a main portion of a salicide block NMOS transistor 130. FIG. 6A is a plan view, and FIG. 6B is a sectional view of the main portion taken along line B—B in FIG. 6A. It should be noted that elements which are substantially common with those of the salicide NMOS transistor 100 in FIGS. 5A and 5B are designated by the same reference numerals.

The salicide block NMOS transistor 130 is a transistor which is produced such that, when the silicide is formed, a salicide block is formed at a salicide block area 139, which includes the gate electrode 105 and partial areas of a source (drain) 133 and a drain (source) 134 in the vicinity of the gate electrode 105, so that the silicide is not formed in this area.

With this structure, the surge current due to ESD does not concentrate at a portion in the impurity diffused layer and flows relatively uniformly so that electric field concentration is not caused. Further, a resistor component in the impurity diffused layer, at areas of the drain and the source where the silicide is not formed thereon, causes a drop in the high ESD surge voltage, and the stress applied to the PN junction is reduced. Thus, ESD resistance is remarkably improved.

The salicide block area is provided so as to extend to both of the drain and the source. This is because that, unlike to a process using a bulk substrate, where no breakdown is caused at a PN junction at a source side when potentials at a well and at the source are the same, in a SOI device having a complete element isolation structure using a buried oxide film and a field oxide film, PN junction breakdown may be caused by breakdown at the source side depending on a polarity of the ESD surge. The same applies to a PMOS transistor.

The salicide block transistor having excellent ESD resistance, as described above, is used, for example, as a final output transistor in a LSI which operates as a semiconductor integrated circuit device. FIG. 8 is a circuit diagram of a main portion showing a position, in a circuit configuration, of a salicide block NMOS transistor 144 used as a final output transistor in an output circuit in an LSI 140.

As shown in FIG. 8, the salicide block NMOS transistor 144 forms, together with a salicide block PMOS transistor 143, a push-pull output circuit, where a drain is connected to an output terminal 142 of the LSI 140. Further, a protective circuit 141 is provided in a wiring path connecting the drain to the output terminal 142.

With this structure, the salicide block transistors 143 and 144, which have excellent ESD resistance, are not broke down even when an ESD surge is applied to the output terminal 142. While, transistors in an internal circuit 145 are protected by the protective circuit 141. Therefore, salicide MOS transistors, such as shown in FIGS. 5A and 5B described above, can be used for forming the internal circuit 145.

FIGS. 7A and 7B show an exemplary structure of the salicide block NMOS transistor 144 shown in the circuit diagram of FIG. 8. FIG. 7A is a plan view, and FIG. 7B is a sectional view of a main portion taken along line C—C in FIG. 7A.

As shown in FIGS. 7A and 7B, the NMOS transistor is fabricated on a SOI substrate by a MOS process. The SOI substrate includes silicon 152 having a buried oxide film therein, formed on a P semiconductor substrate 151 serving as an insulating layer.

During a silicide forming process, no silicide is formed on partial areas of an impurity diffused layer formed of a source (or drain) region 154 and drain (or source) regions 153 and 155, as well as on polysilicon gate electrodes 158 and 159 formed on body regions 156 and 157 via oxide films 160 and 161, because of salicide blocks formed in salicide block areas 162a and 162b, and low resistance silicides 170, 171 and 172 are respectively formed in only areas other than these areas.

An interlayer insulating layer 163 is formed over the silicides. Further, on top of the interlayer insulating layer 163, drain (source) metal wiring 164, source (drain) metal wiring 165 and gate metal wiring 167 are formed. The drain (source) metal wiring 164 includes a connecting portion 164a extending along the silicide 170, a connecting portion 164b extending along the silicide 172, and a coupling portion 164c coupling the connecting portions 164a and 164b together. The source (drain) metal wiring 165 extends along the silicide 171. The gate metal wiring 167 electrically couples the two gate electrodes 158 and 159 with each other.

Further, the interlayer insulating layer 163 is provided with contacts 175 for electrically connecting the silicide 170 to the connecting portion 164a at a plurality of points, contacts 176 for electrically connecting the silicide 172 to the connecting portion 164b at a plurality of points, contacts 177 for electrically connecting the silicide 171 to the source (drain) metal wiring 165 at a plurality of points, and contacts 178 for electrically connecting the two gate electrodes 158 and 159 to the gate metal wiring 167. As described above, the salicide block NMOS transistor 144 used as the final output transistor here has a structure where two salicide block transistors having a large gate width W are arranged in parallel with each other.

By making the transistors having a large gate width W into the salicide block transistor, since resistance of polysilicon of the gate electrodes is large at portions of the gate electrodes which are far from the gate metal wiring 167, to which a gate signal is connected, a very large gate resistance, which is equivalent to a resistor 147, is inevitability inserted. For a device requiring high-speed operation, increase in a gate delay time at the final output transistor has to be avoided.

Therefore, although it is ideal for the salicide block NMOS transistor 144 shown in FIGS. 7A and 7B to have a structure where the low resistance silicide layer is formed only on the gate electrodes 158 and 159, considering an accuracy of masking of the salicide block and the gate electrodes, the silicide layer is inevitably formed also on a part of the drain or source in the vicinity of the gate electrodes 158 and 159, and this lowers ESD resistance. It should be noted that, as a measure against this, a method for reducing the gate resistance without forming the silicide layer on the gate electrodes is disclosed in the above-cited JP-A No. 2001-189429.

The present invention is made on the above-described technical background, and solves the above-described prior-art problems.

SUMMARY OF THE INVENTION

An object of the present invention is to provide a semiconductor device and a semiconductor integrated circuit device, which can solve the above described problem, which excellently accomplish a high-speed device and low power consumption, which are less likely to cause ESD damage, and which can reduce a gate resistance and make a layout design relatively easy.

A semiconductor device according to a first aspect of the invention comprises: a first MOS transistor group including a first gate electrode and a first impurity diffused layer; a second MOS transistor group including a second gate electrode, which is arranged in parallel with the first gate electrode, and a second impurity diffused layer; input signal wiring, to which an input signal is applied, disposed between the first MOS transistor group and the second MOS transistor group; and a conducting portion extending on the first and the second impurity diffused layers for electrically connecting the first and the second gate electrodes to the input signal wiring.

A semiconductor device according to a second aspect of the invention includes first and second MOS transistor groups, each of the first and second MOS transistor groups including gate electrodes disposed substantially in parallel with each other, first and second impurity diffused layers and a silicide layer formed on the first and second impurity diffused layers other than areas thereof in the vicinity of the gate electrodes, the semiconductor device comprising: a conducting portion extending from each of the gate electrode at least to the impurity diffused layers; an interlayer insulating layer covering at least the gate electrodes and the impurity diffused layers; input signal wiring, to which an input signal is applied, formed on the interlayer insulating layer; and a contact formed in the interlayer insulating layer for electrically connecting the input signal wiring to the conducting portion directly or indirectly, wherein the contact is formed outside of an active region including the gate electrodes and the impurity diffused layers.

A semiconductor integrated circuit device according to a third aspect of the invention includes a first transistor used in an output circuit and a second transistor used in an internal circuit, wherein the first transistor comprises one of the above-described semiconductor devices, and the second transistor comprises a salicide MOS transistor.

According to the invention, a semiconductor device, which has excellent electrostatic discharge (ESD) resistance, which suppresses a gate resistance, thereby suppressing increase in a gate delay time, which facilitates layout design and has no risk of damage on an oxide film under a gate electrode, is provided. Further, a semiconductor integrated circuit device employing the semiconductor device in an output circuit thereof is provided.

BRIEF DESCRIPTION OF THE DRAWINGS

FIG. 3 is a plan view showing a structure of a salicide block NMOS transistor of a second embodiment based on the semiconductor device according to the invention.

DETAILED DESCRIPTION OF THE INVENTION

FIRST EMBODIMENT

Figure 1:
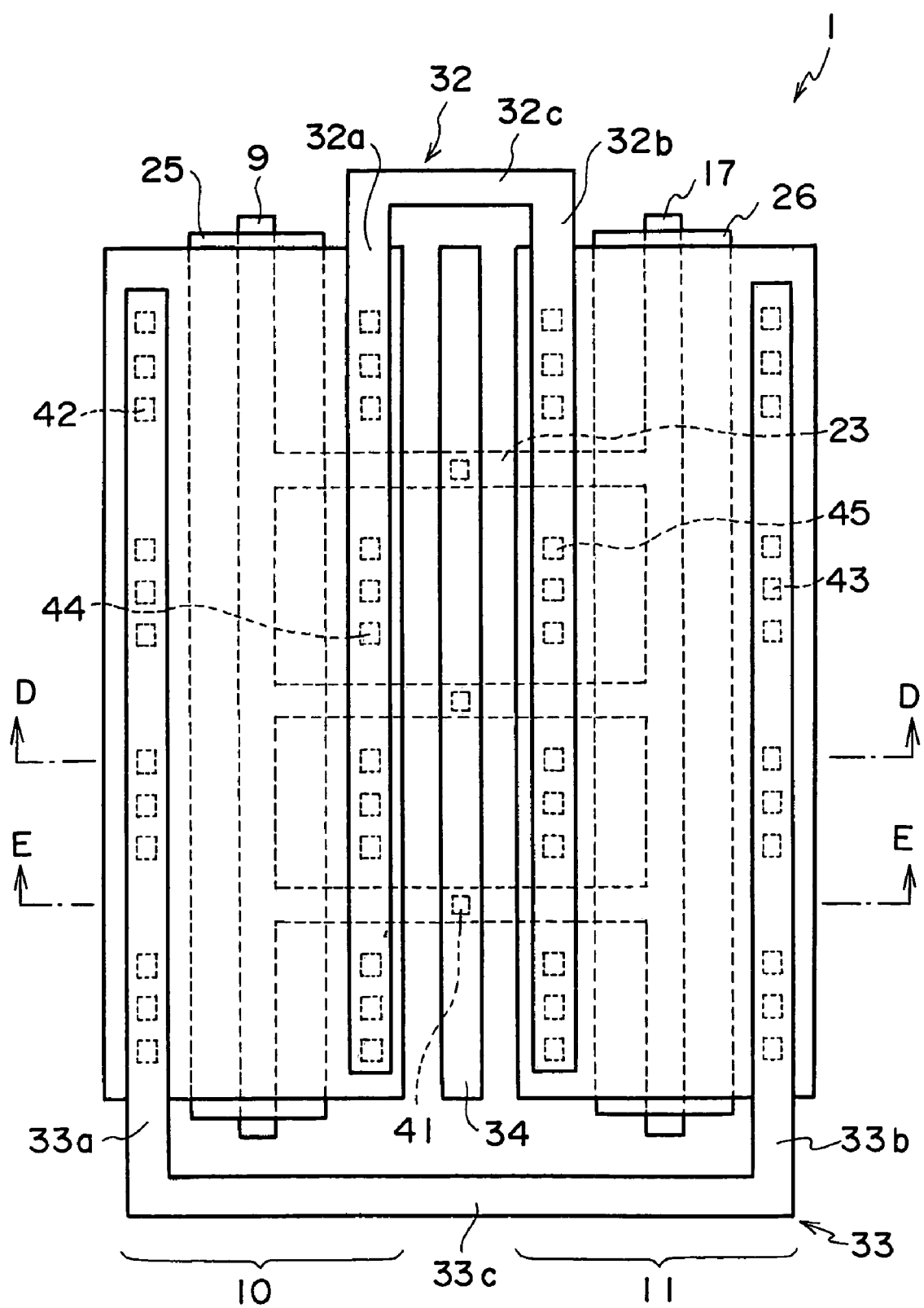
FIG. 1 is a plan view showing a structure of a salicide block NMOS transistor of a first embodiment based on a semiconductor device according to the present invention.
Figure 2A:
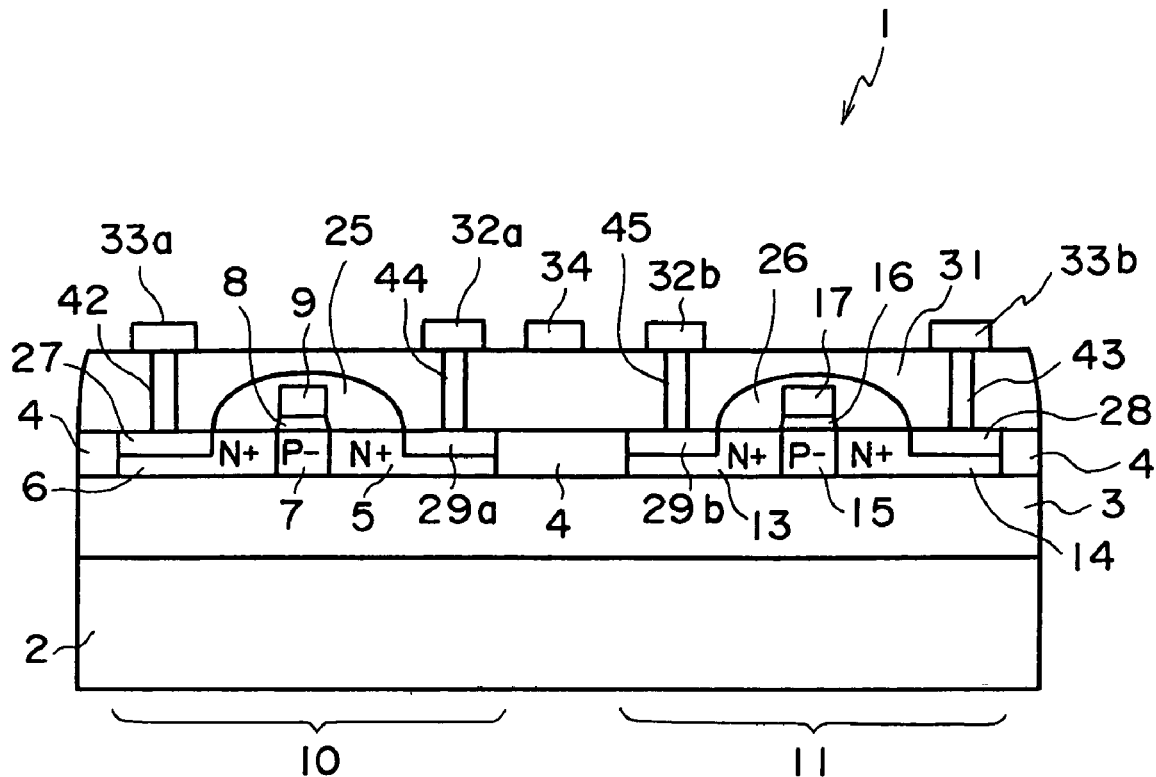
FIG. 2A is a sectional view of the salicide block NMOS transistor taken along line D—D in FIG. 1.
Figure 2B:
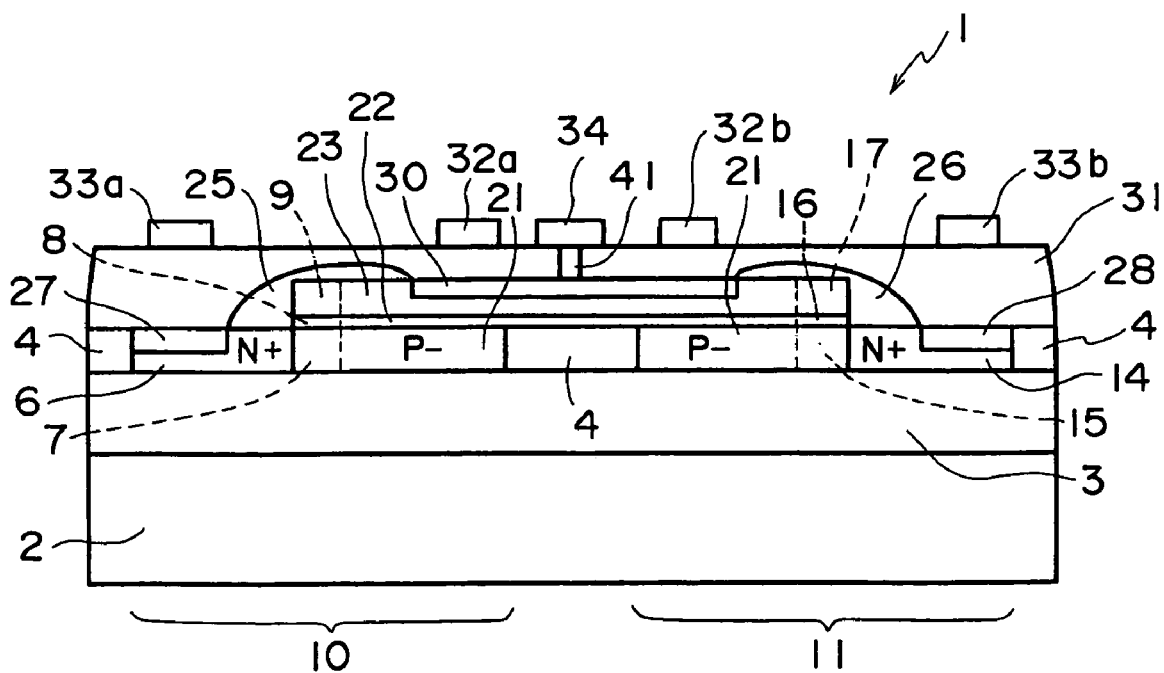
FIG. 2B is a sectional view of the salicide block NMOS transistor taken along line E—E in FIG. 1.

FIG. 1 is a plan view showing a salicide block NMOS transistor 1 forming a semiconductor device according to a first embodiment of the invention, FIG. 2A is a sectional view taken along line D—D in FIG. 1, and FIG. 2B is a sectional view taken along line E—E in FIG. 1.

As shown in these drawings, this semiconductor device includes a semiconductor substrate such as a P silicon substrate 2, a buried oxide film 3 formed on the substrate 2, and two thin silicon layers 10 and 11 formed on the oxide film 3, which are isolated from each other by a field oxide layer 4 serving as an element isolation layer.

In the example shown, the thin silicon layers 10 and 11 forming active regions are respectively formed in a longitudinally (in FIG. 1) elongated rectangular shape, and are arranged in parallel with and adjacent to each other.

In the thin silicon layer 10, a first N+ diffusion region 5 and a second N+ diffusion region 6 are formed by impurity diffusion, and a longitudinally (in FIG. 1) extending P– channel region 7 is formed between the first and second diffusion regions 5 and 6. A polysilicon gate electrode 9 is formed on the channel region 7 via a gate oxide film 8.

Similarly, in the thin silicon layer 11, a first N+ diffusion region 13 and a second N+ diffusion region 14 are formed by impurity diffusion, and a longitudinally (in FIG. 1) extending P– channel region 15 is formed between the first and second diffusion regions 13 and 14. A polysilicon gate electrode 17 is formed on the channel region 15 via a gate oxide film 16.

One of the first and second diffusion regions becomes a source region and the other becomes a drain region. However, in the description below, the first diffusion regions 5 and 13 are supposed to be source regions and the second diffusion regions 6 and 14 are supposed to be drain regions, for convenience.

The gate electrodes 9 and 17 are coupled with each other by coupling portions 23 extending laterally (in FIG. 1), i.e., in a direction of a gate length. The coupling portions 23 are formed of the same material as the gate electrodes 9 and 17, at the same time and integrally or continuously with the gate electrodes 9 and 17.

Coupling portions 22 are formed between the coupling portions 23 and the thin silicon film layers 10 and 11 as well as the field oxide film 4. The coupling portions 22 are formed of the same material as the gate oxide films 8 and 16, at the same time and integrally or continuously with the gate oxide films 8 and 16.

Strip portions 21 lying under the coupling portions 23 and 22 in the thin film 10 are P– as the same as the channel region 7, and are continuous with the channel region 7. As a result, the source region 5 is divided into source region portions by the strip portions 21 which extend laterally (in FIG. 1), i.e., in the direction of the gate length.

Similarly, strip portions 21 lying under the coupling portions 23 and 22 in the thin film 11 are P– as the same as the channel region 15, and are continuous with the channel region 15. As a result, the source region 13 is divided into source region portions by the strip portions 21 which extend laterally (in FIG. 1), i.e., in the direction of the gate length.

Upon fabrication, a polysilicon pattern including the gate electrode 9 and 17 and the coupling portions 23 is formed, and this is used as a mask to form the gate oxide films 8 and 16 and the coupling portions 22. Then, these are used as a mask to form the diffusion regions 5, 6, 13 and 14. Thus, the channel regions 7 and 15 and the strip portions 21 are formed in the thin films 10 and 11 in areas thereof covered by the gate electrodes 9 and 17 and the coupling portions 23.

The channel regions 7 and 15 and the strip portions 21 form a body region.

Subsequently, silicide such as titanium silicide is formed at predetermined areas described below. During the silicide forming process, no silicide is formed on the gate electrode 9 and on partial areas of the impurity diffused layers 5 and 6 at both sides of the gate electrode 9, as well as on the gate electrode 17 and on partial areas of the impurity diffused layers 13 and 14 at both sides of the gate electrode 17, because of salicide blocks formed in salicide block areas 25 and 26. Accordingly, low resistance silicides 29a (see FIG. 2A), 27, 29b (see FIG. 2A), 28 and 30 (see FIG. 2B) are formed at predetermined areas, other than the salicide block areas, of the impurity diffused layers 5, 6, 13 and 14 and polysilicon coupling portions 23. It should be noted that these silicides are formed so as to be electrically isolated from each other.

An interlayer insulating layer 31 is formed over the above elements. Further, drain metal wiring 33, which includes a connecting portion 33a extending along the silicide 27, a connecting portion 33b extending along the silicide 28, and a coupling portion 33c coupling the connecting portions 33a and 33b together, is formed on the interlayer insulating layer 31. Similarly, source metal wiring 32, which includes a connecting portion 32a extending along the silicide 29a lying partially on the source region 5, a connecting portion 32b extending along the silicide 29b lying partially on the source region 13, and a coupling portion 32c (see FIG. 1) coupling the connecting portions 32a and 32b together, is formed on the interlayer insulating layer 31. In addition, on the interlayer insulating layer 31, gate electrode metal wiring 34 extending above the field oxide film 4 in parallel with the gate electrodes 9 and 17 is formed. The gate electrode metal wiring 34 serves as input signal wiring.

The interlayer insulating layer 31 is provided with contacts 44 for electrically connecting the silicide 29a to the connecting portion 32a at a plurality of points, contacts 45 for electrically connecting the silicide 29b to the connecting portion 32b at a plurality of points, contacts 42 for electrically connecting the silicide 27 to the connecting portion 33a at a plurality of points, contacts 43 for electrically connecting the silicide 28 to the connecting portion 33b at a plurality of points, and contacts 41 for electrically connecting the silicide 30 to the gate metal electrode 34 at a plurality of points.

As described above, the source region is divided into a plurality of portions. The contacts 44 are provided so that each portion of the source region 5 is connected to at least one of the contacts 44 via the silicide 29a.

Similarly, the source region 13 is divided into a plurality of portions. The contacts 45 are provided so that each portion of the source region 13 is connected to at least one of the contacts 45 via the silicide 29b.

The source region 5 and the drain region 6 formed in the thin silicon film layer 10, as well as the gate electrode 9 formed above the thin film 10, and the like, together form one salicide block NMOS transistor group. The source region 13 and the drain region 14 formed in the thin silicon film layer 11, as well as the gate electrode 17 formed above the thin film 11, and the like, together form another salicide block NMOS transistor group. The source regions 5 and 13 are connected to each other via the source metal wiring 32, and the like, the drain regions 6 and 14 are connected to each other via the drain metal wiring 33, and the like, and the gate electrode 9 and 17 are together connected to the same gate electrode wiring 34. Thus, these two NMOS transistor groups are connected in parallel with each other, and can be regarded as forming one salicide block NMOS transistor 1 as a whole.

It should be noted that other circuit elements are formed on the silicon substrate 2 and the buried oxide film 3, however, they are not shown in the drawings.

Figure 8:
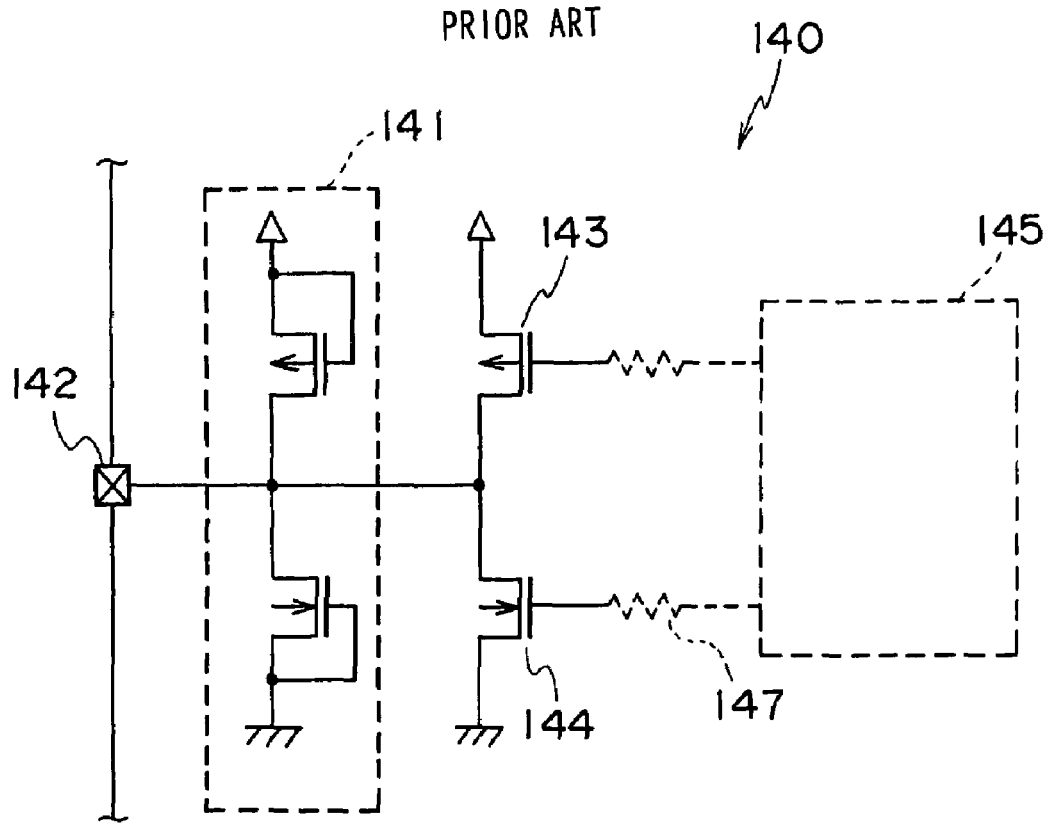
FIG. 8 is a circuit diagram of a main portion showing a position, in a circuit configuration, of a salicide block NMOS transistor used as a final output transistor in an LSI.

The salicide block NMOS transistor 1 having the structure described above operates as a final output transistor in an output circuit in an LSI, for example, in place of the salicide block NMOS transistor 144 shown in FIG. 8.

The polysilicon gate electrodes 9 and 17 are connected to each other via the polysilicon coupling portions 23, which are formed at regular intervals in a extending direction of the gate electrodes 9 and 17. The silicides 30 (FIG. 2B) formed respectively on the coupling portions 23 are electrically connected to each other by the gate electrode metal wiring 34 and the contacts 41 at their middle portions. Since the silicides 30 on the coupling portions 23 are formed to reach the salicide block areas 25 and 26, a resistance between the regions of the gate electrode metal wiring 34 and the gate electrodes 9 and 17 is small and substantially uniform.

Therefore, when the salicide block NMOS transistor 1 is disposed in place of the salicide block NMOS transistor 144 shown in FIG. 8, the gate resistance equivalent to the resistor 147 (see FIG. 8) described above can be reduced.

It should be noted that, in the salicide block NMOS transistor 1, although the source regions 5 and 13 are divided by the strip portions 21, which form a part of the body region, the source regions 5 and 13 are maintained at the same potential by the contacts 44 and 45, and therefore, no influence is exerted on ESD resistance and transistor characteristics of the salicide block NMOS transistor 1.

As described above, in the salicide block NMOS transistor 1 according to the first embodiment, since no silicide layer is formed on the gate electrodes and parts of the source and the drain in the vicinity of the gate electrodes, local breakdown can be prevented and ESD resistance can be enhanced. In addition, a gate resistance can be suppressed, thereby suppressing increase in a gate delay time.

Further, since the contacts 41, which connect the gate electrode metal wiring 34 to the coupling portions 23 leading to the gate electrodes 9 and 17, are provided outside of the active regions, layout design is relatively easy and there is no risk of damaging the oxide film under the gate electrode without using a pad, thereby improving quality of products.

SECOND EMBODIMENT

Figure 4A:
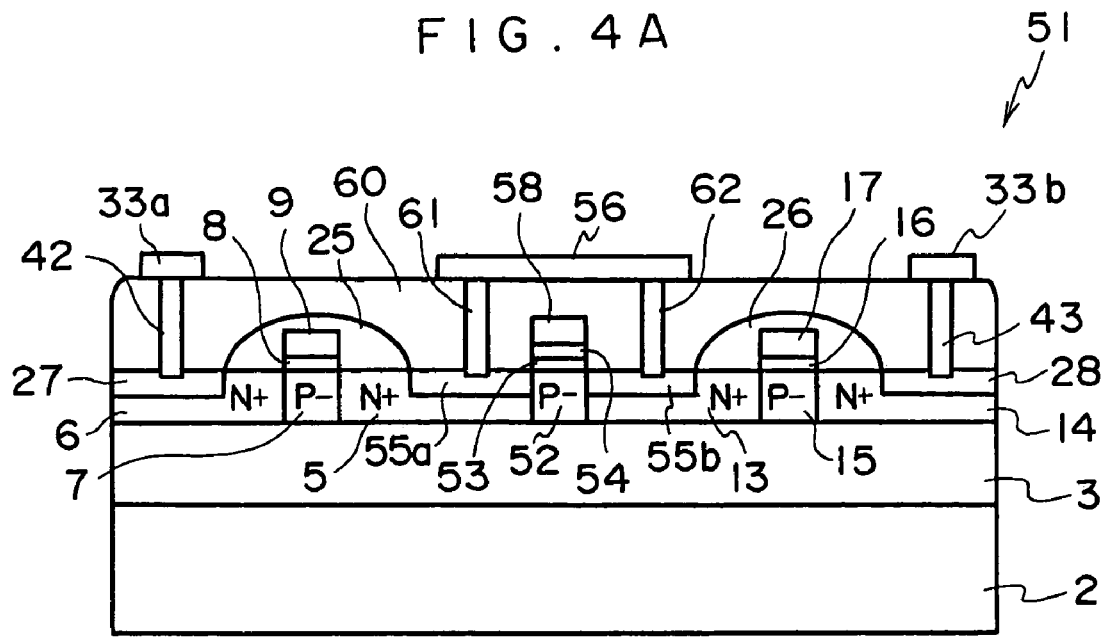
FIG. 4A is a sectional view of the salicide block NMOS transistor taken along line F—F in FIG. 3.
Figure 4B:
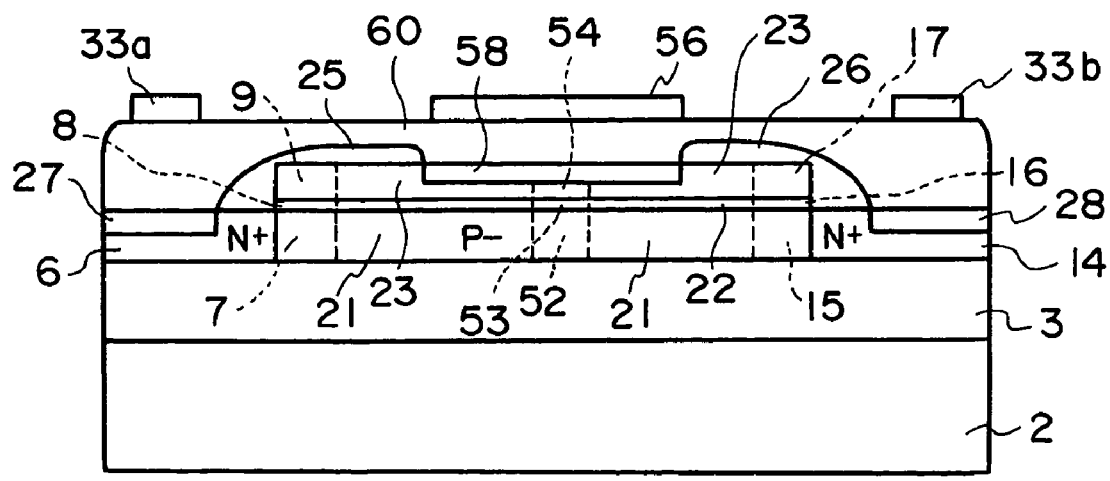
FIG. 4B is a sectional view of the salicide block NMOS transistor taken along line G—G in FIG. 3.
Figure 5A:
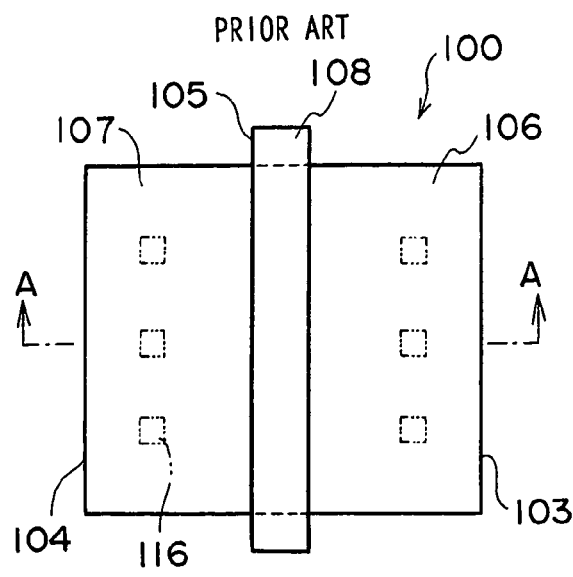
FIG. 5A is a plan view showing a structure of a main portion of a conventional salicide block NMOS transistor fabricated on a SOI substrate.
Figure 5B:
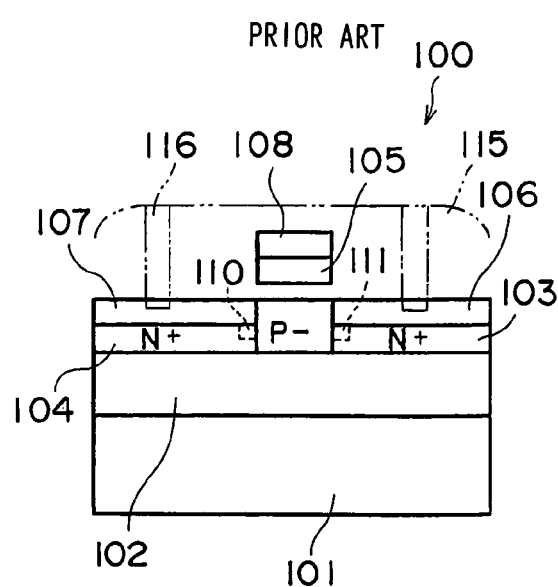
FIG. 5B is a sectional view of the main portion of the salicide block NMOS transistor taken along line A—A in FIG. 5.
Figure 6A:
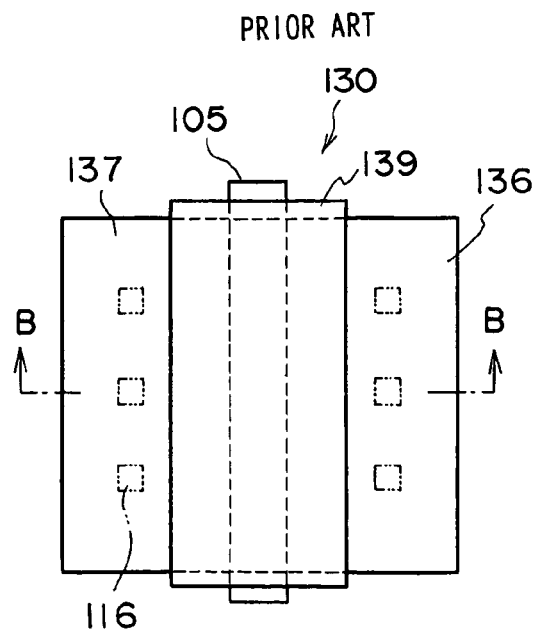
FIG. 6A is a plan view showing a structure of a main portion of another conventional salicide block NMOS transistor.
Figure 6B:
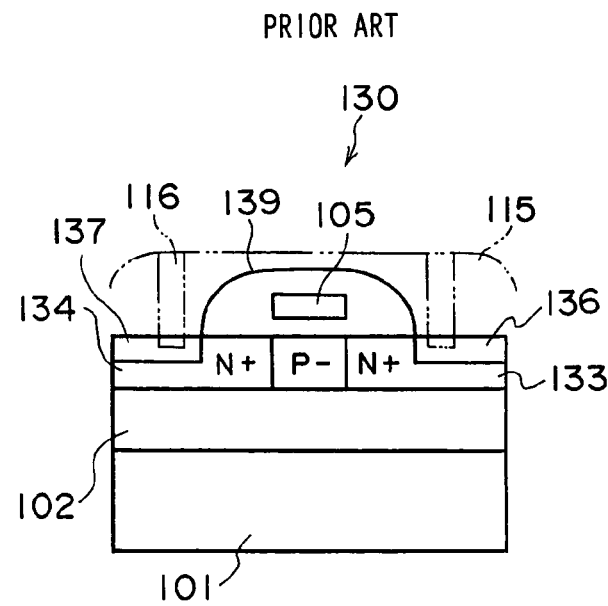
FIG. 6B is a sectional view of the main portion of the salicide block NMOS transistor taken along line B—B in FIG. 6.
Figure 7A:
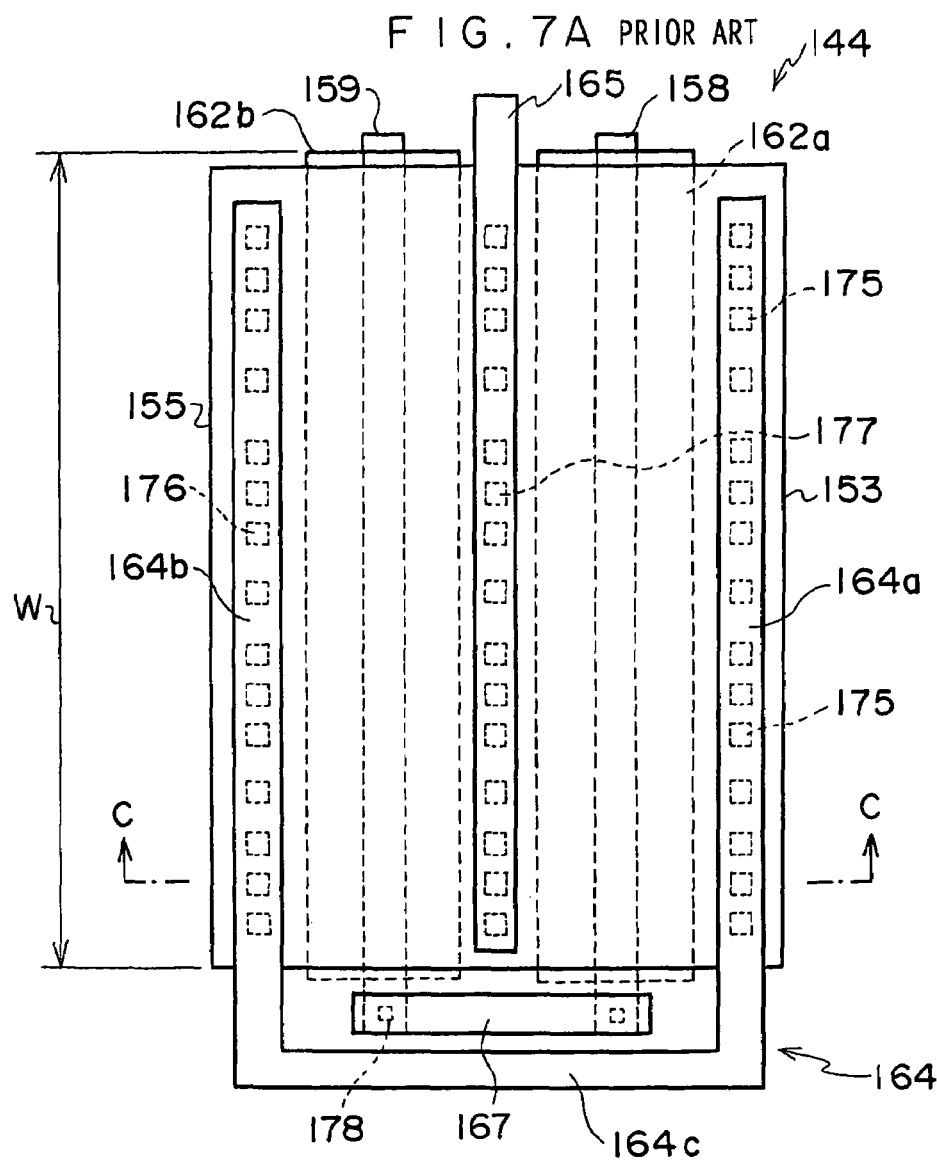
FIG. 7A is a plan view showing a structure of yet another conventional salicide block NMOS transistor.
Figure 7B:
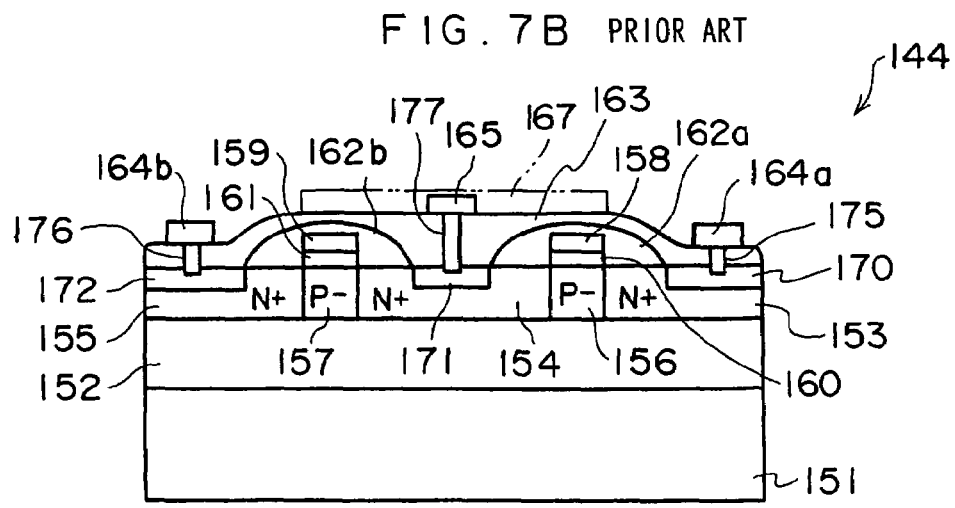
FIG. 7B is a sectional view of the main portion of the salicide block NMOS transistor taken along line C—C in FIG. 7A.

FIG. 3 is a plan view showing a structure of a salicide block NMOS transistor 51 forming a semiconductor device according to a second embodiment of the invention, FIG. 4A is a sectional view taken along line F—F in FIG. 3, and FIG. 4B is a sectional view taken along line G—G in FIG. 3. In the following description of the salicide block NMOS transistor 51 according to the second embodiment, elements which are common with those of the above-described salicide block NMOS transistor 1 of the first embodiment are designated by the same reference numerals and are not described in detail. Only differences between the first and the second embodiments are described in detail.

Main differences between the salicide block NMOS transistor 51 of the second embodiment and the above-described salicide block NMOS transistor 1 of the first embodiment shown in FIG. 1 lie in that no field oxide film layer 4 (see FIGS. 2A and 2B) for element isolation is provided, and a wiring portion 54 made of polysilicon is provided, and accompanying this, shapes and arrangements of the source (drain) metal wiring 56 and the gate electrode metal wiring 57 are changed.

Further, instead of the two thin silicon films 10 and 11 in the first embodiment, a single thin silicon film 65 is provided, and this forms a single active region 59. A strip-like isolator 52, which is the same P-type as the channel regions 7 and 15 and the strip portions 21, is formed in the thin film 65 under the wiring portion 54 (described later), and the isolator 52 isolates the thin film 65 into tow areas 65a and 65b (see FIG. 3). The diffusion regions 5, 6, 13 and 14 and the body regions 7, 15 and 21 in the regions 65a and 65b have the same arrangement as in the first embodiment. The isolator 52 is continuous with the strip portions 21, and together with the channel regions 7 and 15 and the strip portions 21, forms a part of the body region. In other words, the isolator 52 extends in a width direction of the gate electrodes 9 and 17, and intersects and is continuous with the strip portions 21.

The wiring portion 54 is formed of the same material as the gate electrodes 9 and 17 and the coupling portions 23 at the same time and integrally or continuously with the gate electrodes 9 and 17 and the coupling portions 23. In other words, the wiring portion 54 integrally intersects with the coupling portions 23.

The oxide film 53 lying under the wiring portion 54 is formed of the same material as the gate oxide films 8 and 16 and the coupling portions 22 at the same time and integrally or continuously the gate oxide films 8 and 16 and the coupling portions 22.

The coupling portions 23 and the wiring portion 54 together form a conducting portion for connecting the gate electrodes 9 and 17 to the gate electrode metal wiring 57.

Subsequently, silicides are formed at predetermined areas described below. During the silicide forming process, no silicide is formed on the gate electrode 9 and on partial areas of the impurity diffused layers 5 and 6 at both sides of the gate electrode 9, as well as on the gate electrode 17 and on partial areas of the impurity diffused layers 13 and 14 at both sides of the gate electrode 17, because of salicide blocks formed in salicide block areas 25 and 26. Accordingly, low resistance suicides 55a (see FIG. 4A), 27, 55b (see FIG. 4A), 28 and 58 (see FIG. 4B) are formed at predetermined areas, other than the salicide block areas, of the impurity diffused layers 5, 6, 13 and 14, the wiring portion 54 and polysilicon coupling portions 23. It should be noted that these silicides, which are designated by different reference numerals, are formed so as to be electrically isolated from each other.

An interlayer insulating layer 60 is formed over the above elements. Further, source metal wiring 56, which extends along the suicides 55a and 55b, is formed on the interlayer insulating layer 60. Furthermore, as shown in FIG. 3, gate electrode metal wiring 57 is formed, via the insulating layer 60 (see FIGS. 4A and 4B), above an end portion 54a of the wiring 54 extending on the field oxide film (not shown) outside of the active region 59.

Moreover, the interlayer insulating layer 60 is provided with contacts 61 for electrically connecting the silicide 55a on the source region 5 to the source metal wiring 56 at a plurality of points, contacts 62 for electrically connecting the silicide 55b on the source region 13 to the source metal wiring 56 at a plurality of points, and a contact 63 for electrically connecting the silicide 58 on the end portion 54a of the wiring portion 54 to the gate electrode metal wiring 57.

The isolator 52 (body region) lying under the wiring portion 54 forms a reverse-biased PN junction, and isolates the source region 5 of the MOS transistor from the source region 13 of the MOS transistor.

The salicide block NMOS transistor 51 having the structure described above operates as a final output transistor in an output circuit in an LSI, for example, in place of the salicide block NMOS transistor 144 shown in FIG. 8.

The polysilicon gate electrodes 9 and 17 are electrically connected to the gate electrode metal wiring 57 (see FIG. 3) via the polysilicon coupling portions 23, which are formed at regular intervals in a extending direction of the gate electrodes 9 and 17, and the wiring portion 54. Further, since the polysilicon coupling portions 23 and the wiring portion 54 are provided with the silicide layer on most of their areas reaching the salicide block areas 25 and 26, a resistance between the gate electrode metal wiring 57 and each of the gate electrodes 9 and 17 is small and substantially uniform.

Therefore, when the salicide block NMOS transistor 51 is disposed in place of the salicide block NMOS transistor 144 shown in FIG. 8, the gate resistance equivalent to the resistor 147 (see FIG. 8) described above can be reduced.

It should be noted that, in the salicide block NMOS transistor 51, although the source regions 5 and 13 are divided by the isolator 52 and the strip portions 21, which form a part of the body region, the source regions 5 and 13 are maintained at the same potential by the contacts 61 and 62, and therefore, no influence is exerted on ESD resistance and transistor characteristics of the salicide block NMOS transistor 51.

As described above, in the salicide block NMOS transistor 51 according to the second embodiment, since no silicide layer is formed on the gate electrodes and parts of the source and drain in the vicinity of the gate electrodes, local breakdown can be prevented and ESD resistance can be maintained at a high level. In addition, a gate resistance can be suppressed, thereby suppressing increase in a gate delay time.

Further, since the contacts 63, which connect the gate electrode metal wiring 57 to the silicide 58 leading to the gate electrodes 9 and 17, are provided outside of the active region, layout design is relatively easy and there is no risk of damaging the oxide film under the gate electrode, thereby improving quality of products.

Moreover, since a plurality of transistors can be formed in the same thin film without providing an element isolation layer such as the field oxide film layer 4 in the salicide block NMOS transistor 1 of the above-described first embodiment, a circuit area can be made smaller than that of the first embodiment, where the transistors are formed by separating the active region.

THIRD EMBODIMENT

Figure 9:
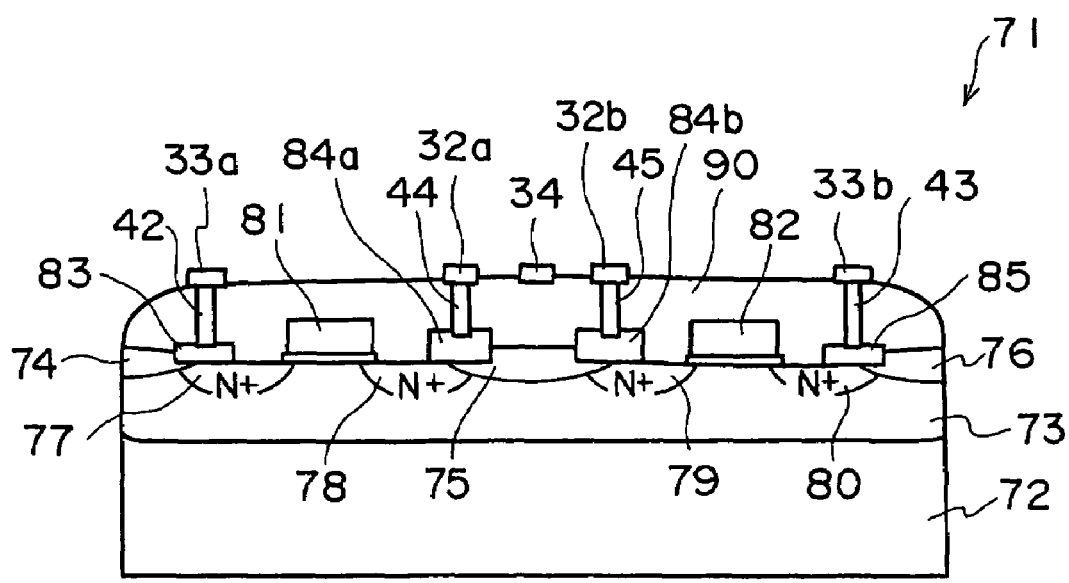
FIG. 9 is a sectional view showing a structure of a salicide block NMOS transistor of a third embodiment based on the semiconductor device according to the invention.

FIG. 9 is a sectional view showing a structure of a salicide block NMOS transistor 71 according to a third embodiment based on the semiconductor device of the invention.

The salicide block NMOS transistor 71 is formed of two NMOS transistors, which are formed by a MOS process on a bulk substrate including a P-well 73 formed on a P-semiconductor substrate 72, in parallel with each other and isolated by element isolation oxide films 74, 75 and 76. This salicide block NMOS transistor 71 is equivalent to the above-described salicide block NMOS transistor 1 shown in FIGS. 1, 2A and 2B, where the SOI substrate of the salicide block NMOS transistor 1 is replaced with the bulk substrate.

Therefore, elements of the salicide block NMOS transistor 71 which are common with those of the salicide block NMOS transistor 1 of the first embodiment are designated by the same reference numerals or not shown in the drawings and are not described in detail. Only differences between the first and the third embodiments are described in detail. It should be noted that a cross section of the salicide block NMOS transistor 71 shown in the sectional view of FIG. 9 corresponds to the cross section of the part of the salicide block NMOS transistor 1 of the first embodiment shown in FIG. 2A, which is taken along line D—D in the plan view thereof of FIG. 1.

As shown in FIG. 9, source regions 78 and 79, drain regions 77 and 80 and gate electrodes 81 and 82 are formed on the bulk substrate by a MOS process. Further, similarly to the salicide block NMOS transistor 1 of the first embodiment, silicides 83, 84a, 84b and 85 are formed on areas other than the gate electrodes 81 and 82 and partial areas of the source and the drain at both sides of the gate electrodes 81 and 82.

An interlayer insulating layer 90 formed to cover the suicides 83, 84a, 84b and 85; source metal wirings 32a and 32b, drain metal wirings 33a and 33b and gate electrode metal wiring 34 formed on the interlayer insulating layer 90; and contacts 42, 43, 44 and 45 formed in the interlayer insulating layer 90 are formed substantially in the same manner as in the first embodiment described above, and therefore description thereof is omitted here.

The salicide block NMOS transistor 71 having the above-described structure, which is produced using the bulk substrate, also provides effects which are similar to those of the first embodiment described above.

It should be noted that, although the source regions of the two MOS transistors are isolated from each other by the field oxide film 4, the body region 52 or the P-well 73 in the above-described embodiments, such isolation may not necessarily be provided since the source regions are, anyway, connected to each other by the wiring.

Although the above embodiments are described only about the cases of NMOS transistors, the invention is not limited to NMOS transistors. The invention can assume various forms such as a PMOS transistor, which is formed on a SOI or bulk substrate by a MOS process (for example, by changing the N+ and P− impurity diffused layers in FIGS. 2A and 2B to P+ and N− impurity diffused layers).

It should be noted that the terms indicating positional relationship, such as "above" and "under", are used for convenience in the above-described embodiments and appended claims, and are not intended to limit absolute positional relationships between the elements arranged in semiconductor devices and semiconductor integrated circuit devices of the invention.

What is claimed is:

1. A semiconductor device comprising:
   a first MOS transistor group including a first gate electrode and a first impurity diffused layer;
   a second MOS transistor group including a second gate electrode, which is arranged in parallel with the first gate electrode, and a second impurity diffused layer;
   input signal wiring, to which an input signal is applied, disposed between the first MOS transistor group and the second MOS transistor group; and
   a conducting portion extending on the first and the second impurity diffused layers for electrically connecting the first and the second gate electrodes to the input signal wiring;
   wherein the conducting portion is formed in the same layer as the first and the second gate electrodes and extends from the first gate electrode to the second gate electrode.

2. The semiconductor device according to claim 1, wherein a silicide layer is formed in each of the first and the second impurity diffused layers at a position spaced apart by a predetermined distance from the first gate electrode or the second gate electrode.

3. The semiconductor device according to claim 1, further comprising an interlayer insulating layer disposed between the conducting portion and the input signal wiring, the interlayer insulating layer being provided with a contact for electrically connecting the conducting portion to the input signal wiring.

4. The semiconductor device according to claim 3, further comprising an element isolation layer disposed between the first and the second MOS transistor groups, wherein the input signal wiring is formed above and along the element isolation layer, the conducting portion comprises a plurality of coupling portions, which extend from the gate electrodes to the impurity diffused layers and to the element isolation layer and are coupled with the gate electrodes at different points in a width direction of the gate electrodes, and the contact comprises a plurality of contacts, which connect the coupling portions to the input signal wiring on the element isolation layer.

5. The semiconductor device according to claim 1, wherein the gate electrodes and the conducting portion comprise polysilicon.

6. The semiconductor device according to claim 1, wherein a suicide layer is formed on the conducting portion.

7. A semiconductor device including first and second MOS transistor groups, each of the first and second MOS transistor groups including gate electrodes disposed substantially in parallel with each other, first and second impurity diffused layers and a suicide layer formed on the first and second impurity diffused layers other than areas thereof in the vicinity of the gate electrodes, the semiconductor device comprising:
   a conducting portion extending from each of the gate electrode at least to the impurity diffused layers;
   an interlayer insulating layer covering at least the gate electrodes and the impurity diffused layers;
   input signal wiring, to which an input signal is applied, formed on the interlayer insulating layer; and
   a contact formed in the interlayer insulating layer for electrically connecting the input signal wiring to the conducting portion directly or indirectly,
   wherein the contact is formed outside of an active region including the gate electrodes and the impurity diffused layers.

8. The semiconductor device according to claim 7, further comprising an element isolation layer disposed between the first and the second MOS transistor groups, wherein the input signal wiring is formed above and along the element isolation layer, the conducting portion comprises a plurality of coupling portions, which extend from the gate electrodes to the impurity diffused layers and to the element isolation layer and are coupled with the gate electrodes at different points in a width direction of the gate electrodes, and the contact comprises a plurality of contacts, which connect the coupling portions to the input signal wiring on the element isolation layer.

9. The semiconductor device according to claim 7, wherein the conducting portion comprises a plurality of coupling portions, which extend from the gate electrodes to the impurity diffused layers and are coupled with the gate electrodes at different points in a width direction of the gate electrodes, and a wiring portion, which extends in parallel with the gate electrodes from the active region between the pair of gate electrodes to an area outside of the active region and is coupled with the coupling portions.

10. The semiconductor device according to claim 7, wherein the gate electrodes and the conducting portion comprise polysilicon.

11. The semiconductor device according to claim 7, wherein a silicide layer is formed on the conducting portion.

12. A semiconductor integrated circuit device including a first transistor used in an output circuit and a second transistor used in an internal circuit, wherein
   the first transistor comprises: a semiconductor device including first and second MOS transistor groups, each of the first and second MOS transistor groups including gate electrodes disposed substantially in parallel with each other, first and second impurity diffused layers and a silicide layer formed on the first and second impurity diffused layers other than areas thereof in the vicinity of the gate electrodes, the semiconductor device comprising:

a conducting portion extending from each of the gate electrode at least to the impurity diffused layers;

an interlayer insulating layer covering at least the gate electrodes and the impurity diffused layers;

input signal wiring, to which an input signal is applied, formed on the interlayer insulating layer; and a contact formed in the interlayer insulating layer for electrically connecting the input signal wiring to the conducting portion directly or indirectly, wherein the contact is formed outside of an active region including the gate electrodes and the impurity diffused layers; and the second transistor comprises a salicide MOS transistor.

* * * * *